United States Patent [19]
Makita et al.

[11] Patent Number: 5,970,327
[45] Date of Patent: Oct. 19, 1999

[54] METHOD OF FABRICATING A THIN FILM TRANSISTOR

[75] Inventors: Naoki Makita; Takashi Funai, both of Nara; Toru Takayama, Kanagawa, all of Japan

[73] Assignee: Semiconductor Energy Laboratory Co., Ltd., Kanagawa, Japan

[21] Appl. No.: 08/975,446

[22] Filed: Nov. 21, 1997

Related U.S. Application Data

[63] Continuation of application No. 08/459,159, Jun. 2, 1995, abandoned.

[30] Foreign Application Priority Data

Jun. 15, 1994 [JP] Japan .................................. 6-156594

[51] Int. Cl.$^6$ .............................................. H01L 21/336
[52] U.S. Cl. ...................... 438/166; 438/486; 438/487
[58] Field of Search .................................. 438/166, 486, 438/487, FOR 155, FOR 201, FOR 184, FOR 261, FOR 393

[56] References Cited

U.S. PATENT DOCUMENTS

| | | | |
|---|---|---|---|
| 3,065,112 | 11/1962 | Gilles et al. ................................. | 117/7 |
| 4,357,179 | 11/1982 | Adams et al. .......................... | 437/101 |
| 5,147,826 | 9/1992 | Liu et al. . | |
| 5,275,851 | 1/1994 | Fonash et al. . | |
| 5,292,675 | 3/1994 | Codama .................................... | 437/21 |
| 5,501,989 | 3/1996 | Takayama et al. ........................ | 437/21 |
| 5,508,532 | 4/1996 | Teramoto .................................. | 257/59 |
| 5,510,146 | 4/1996 | Miyasaka ................................. | 427/255 |
| 5,529,937 | 6/1996 | Zhang et al. ................................ | 117/8 |
| 5,534,716 | 7/1996 | Takemura .................................. | 257/72 |

OTHER PUBLICATIONS

"Crystallized Si Films By Low–Temperature Rapid Thermal Annealing Of Amorphous Silicon", R. Kakkad, J. Smith, W.S. Lau, S.J. Fonash, J. Appl. Phys. 65 (5), Mar. 1, 1989, 1989 American Institute of Physics, p. 2069–2072.

"Polycrystalline Silicon Thin Film Transistors on Corning 7059 Glass Substrates Using Short Time, Low Temperature Processing", G. Liu, S.J. Fonash, Appl. Phys. Lett. 62 (20), May 17, 1993, 1993 American Institute of Physics, pp. 2554–2556.

"Selective Area Crystallization of Amorphous Silicon Films by Low–Temperature Rapid Thermal Annealing", Gang Liu and S.J. Fonash, Appl. Phys. Lett. 55 (7), Aug. 14, 1989, 1989 American Institute of Physics, p. 660–662.

"Low Temperature Selective Crystallization of Amorphous Silicon", R. Kakkad, G. Liu, S.J. Fonash, Journal of Non–Crystalline Solids, vol. 115, (1989), p. 66–68.

C. Hayzelden et al., "In Situ Transmission Electron Microscopy Studies of Silicide–Mediated Crystallization of Amorphous Silicon" (3 pages).

A.V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

T. Hempel et al., "Needle–Like Crystallization of Ni Doped Amorphous Silicon Thin Films", *Solid State Communications*, vol. 85, No. 11, pp. 921–924, 1993.

*Primary Examiner*—Mary Wilczewski
*Attorney, Agent, or Firm*—Sixbey, Friedman, Leedom & Ferguson, P.C.; Gerald J. Ferguson, Jr.; Jeffrey L. Costellia

[57] ABSTRACT

A semiconductor device comprising a substrate having thereon an amorphous silicon film fabricated by a reduced pressure chemical vapor deposition, characterized in that a thin film transistor is provided by using a crystalline silicon film obtained by effecting crystal growth in parallel with the surface of the substrate at the periphery of a region containing a selectively introduced metallic element, the region being obtained by selectively introducing a metallic element capable of accelerating the crystallization of the amorphous silicon film and heating the region thereafter.

29 Claims, 8 Drawing Sheets

METHOD OF FABRICATING A THIN FILM TRANSISTOR

This application is a Continuation of Ser. No. 08/459,159, filed Jun. 2, 1995, now abandoned.

BACKGROUND OF THE INVENTION

The present invention relates to a semiconductor device using a TFT (thin film transistor) provided on an insulating substrate such as glass substrate, and to a process for fabricating the same. More particularly, the present invention relates to a semiconductor device usable for a liquid crystal display device of an active matrix type, and to a process for fabricating the same.

The semiconductor devices comprising TFTs on insulating substrates (such as glass substrates) include liquid crystal display devices of active matrix type and image sensors using the TFTs for driving pixels. In general, thin-film silicon semiconductors can be roughly classified into two types: one is an amorphous silicon semiconductor (a-Si), and the other is a crystalline silicon semiconductor. An amorphous silicon semiconductor can be fabricated relatively easily by a vapor phase process at a low temperature, and by mass production. Accordingly, amorphous silicon semiconductors are employed most generally in the TFTs of the devices above. However, in order to obtain a high speed operation, it has been strongly desired to establish a process for fabricating a TFT utilizing a crystalline silicon semiconductor, because amorphous silicon semiconductors are still inferior to the crystalline silicon semiconductors with respect to physical properties such as the electrical conductivity. Known crystalline semiconductors include polycrystalline silicon, microcrystalline silicon, amorphous silicon partly comprising crystalline components, and semi-amorphous silicon which exhibits an intermediate state between crystalline silicon and amorphous silicon.

A thin film of a crystalline silicon semiconductor enumerated above can be fabricated by any of the following known processes:

(1) A process which comprises directly depositing a crystalline film in the step of film deposition;

(2) A process which comprises depositing an amorphous semiconductor film, and then irradiating a laser beam to the film to obtain a crystallized semiconductor by taking advantage of the laser beam energy; and (3) A process which comprises depositing an amorphous semiconductor film, and then applying thermal energy to crystallize the film to obtain a crystalline semiconductor.

With respect to the above first process, it is technologically difficult to form a uniform film having favorable semiconductor properties on the entire surface of the substrate because the crystallization proceeds simultaneously with the film deposition. Furthermore, a thick film process is indispensable in this case to obtain crystalline silicon composed of large grains. Moreover, this process is uneconomical, because it excludes the use of a low cost glass substrate due to the presence of a film deposition step which requires a temperature as high as 600° C. or even higher.

The second process utilizes the crystallization phenomena in a melting and solidification process. Thus, although the grain size of the obtained film is relatively small, the grain boundary thereof is favorably treated with to provide a high quality crystalline silicon film. However, concerning a process employing the most commonly used laser at present, i.e., an excimer laser, there can be found problems to be overcome. Firstly, considering that a laser beam can irradiate too small an area at a time, the process is still disadvantageous in that it can only afford a low throughput. Furthermore, the laser is not sufficiently stable to cover the entire surface of a large area substrate with a uniform film. Thus, it can be safely said that this process awaits a further advanced technology.

The third process is superior to the above first second processes concerning its applicability to the deposition of large area films. However, it also requires a thermal treatment at a high temperature of 600° C. or even higher during the crystallization. This process also excludes the use of inexpensive glass substrates, and moreover, yields a low throughput. Thus, it is required to overcome the conflicting problems of lowering the film deposition temperature and crystallizing the film in a short period of time. Furthermore, this process is based on a solid phase crystallization phenomena. Accordingly, the crystal grains grow in parallel with the substrate to occasionally provide large grains having a diameter as large as some micrometers. However, on the other hand, grains grow and collide with each other to form the boundaries. The grain boundaries thus formed are the main cause of lowering the mobility of a TFT, because these grain boundaries function as trap levels for the carriers.

To overcome the various problems above, a process for fabricating a thin film of crystalline silicon is proposed in Japanese patent application No. 5-218156 (which was published (laid-open) as a Publication No. 7-58338 on Mar. 3, 1995). This process enables a low crystallization temperature and a short-time processing at the same time, and it minimizes the influence of the grain boundaries.

In the process above, an impurity metal element such as nickel (Ni) is incorporated in an amorphous silicon film to provide nuclei for the crystallization. By thus adding an impurity metal element, the rate of nucleation in the initial period of crystallization as well as that of nucleus growth in the later stages of crystallization can be considerably increased as to provide a film having a sufficiently high crystallinity by effecting heat treatment at a temperature of 580° C. or lower for a duration of about 4 hours. The mechanism of the nucleation and growth of nuclei in this process is yet to be made clear, however, assumably, the impurity metal elements function as the nuclei for generating nuclei in an earlier stage, and then as a catalyst to accelerate the crystal growth.

By selectively providing impurity metal elements on a part of the substrate, a crystalline silicon film and an amorphous silicon film can be formed selectively on the same substrate. By further continuing the heat treatment, the grain growth extends in a lateral direction (i.e., a direction in parallel with the surface of the substrate) from the crystallized portion into which the metal impurity is incorporated selectively to an adjacent region in which the metal is not directly added. This portion in which crystal growth occurred in the lateral direction is referred to simply hereinafter as a "laterally grown portion". In the laterally grown portion, needle-like or columnar crystals are found to extend in parallel with the substrate and in a direction of crystal growth. No grain boundaries are found in the direction of crystal growth. Thus, by arranging a channel region of a TFT along with the laterally grown portion, a high performance TFT can be realized.

Figure 5A:
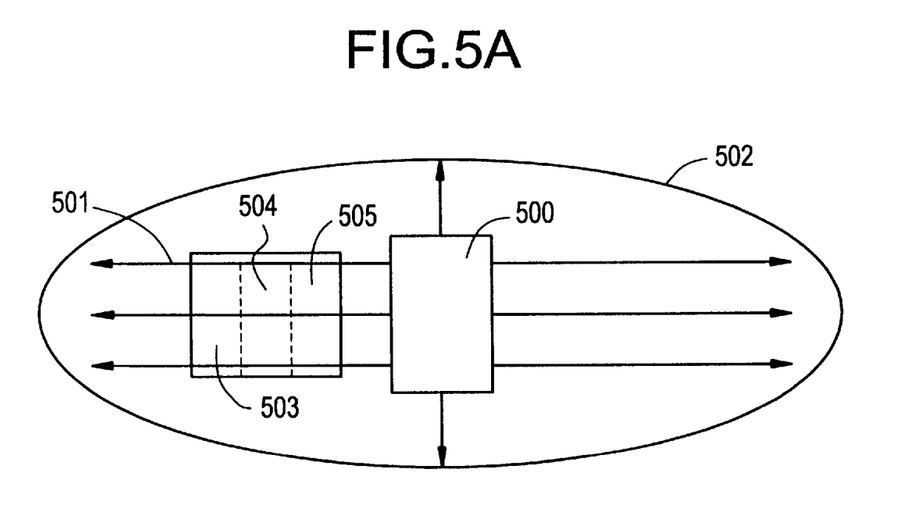
FIGS. 5(A) and 5(B) are each a planar view for showing a relation between a crystal growth direction and a TFT.
Figure 5B:
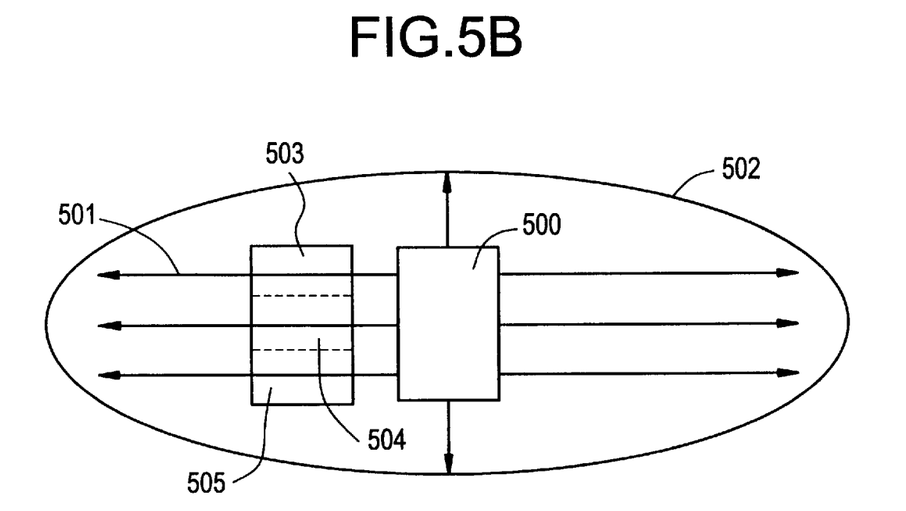

For instance, a channel portion of a TFT can be fabricated in a manner illustrated in FIGS. 5(A) and 5(B). FIGS. 5(A) and 5(B) are each a planar view of a TFT utilizing a laterally grown portion. The fabrication process comprises depositing a mask film comprising a silicon dioxide film and the like on the surface of a thin film of amorphous silicon formed on the entire surface of the substrate, and an impurity metal element is introduced to the thin film of amorphous silicon after opening a window 500 in the mask film to incorporate impurities therethrough. By applying a heat treatment at about 550° C. for a duration of about 4 hours, the region 500 into which an impurity metal element is added undergoes crystallization while leaving over the rest of the portions in the amorphous state. By further continuing the heat treatment for about 8 hours, the region 500 into which impurity metal element is added grows outward in the lateral direction 501 to provide a laterally grown portion 502. A TFT can be fabricated by using the laterally grown portion 502. By providing a source region 503, a channel region 504, and a drain region 505 in the laterally grown portion 502 in an arrangement illustrate in FIG. 5(A), the direction of the carrier movement can be aligned with the direction of the crystal growth 501. Accordingly, a high mobility TFT having no grain boundaries in the direction of carrier movement can be implemented.

Furthermore, a TFT having a high ON/OFF ratio can be fabricated by providing a source region 503, a channel region 504, and a drain region 505 with respect to the laterally grown portion 502 in an arrangement illustrate in FIG. 5(B). That is, grain boundary portions can be eliminated from the region of electric field-concentrated regions provided to the end portions of the drain, and the density of grain boundary traps at the front end portions of the drain can be reduced. The grain boundary traps are found to be the cause for increasing leak current when the TFT is in an OFF operation.

The technology proposed in Japanese patent application No. 5-218156 enables the formation of not only a high performance TFT, but also various types of TFTs fabricated on a same substrate.

Although the technology disclosed in the above Japanese patent application No. 5-218156 is very effective, there are still several problems to be overcome.

A sufficiently long distance for a lateral growth, such as to cover at least the channel region of a TFT, is necessary to apply the technology. Because the region which is left over after the lateral growth remains as an amorphous silicon film, if lateral growth occurs only insufficiently, laterally grown crystalline silicon film and an amorphous silicon film will remain mixed in the channel region as to greatly impair the characteristics of the TFT. Furthermore, even if the channel would be formed by a laterally grown crystalline silicon, if the so-called contact region corresponding to a source or a drain region should remain as an amorphous silicon film, the resistance in the contact region would increase as to make it impossible to realize sufficiently high TFT characteristics.

In the process disclosed in Japanese patent application No. 5-218156, an amorphous silicon (a-Si) film deposited by plasma-assisted CVD (referred to simply hereinafter as "plasma CVD") is used as a starting film for the laterally grown crystalline silicon film. A plasma CVD process is currently put into practice in a process for a-Si TFT, because it is suitable for mass production of a-Si films under a low temperature. However, in view of the applicability thereof to the fabrication of a starting film for a crystalline silicon film, an a-Si film generates nuclei at a relatively high rate. Hence it is difficult to obtain a high quality crystalline silicon film from the a-Si film by effecting crystallization in an ordinary solid phase growth method without adding any impurity metal element.

In case of adding an impurity metal element as described in the technology disclosed in Japanese patent application No. 5-218156, the crystallization of a region into which the impurity metal element is directly added depends only on the concentration of the metal element added therein, and not on the type of the starting a-Si film. However, in a laterally grown portion, the nucleation rate in the a-Si film in the direction of lateral growth is found as a problem to be considered. That is, when an a-Si film deposited by plasma CVD process should be used as the starting film for fabricating a laterally grown crystalline silicon film, the lateral growth would be hindered by a general crystal growth which occurs from a naturally generated nuclei in the a-Si region. Accordingly, the lateral growth would not occur over a sufficiently long distance as to cover the channel region of a TFT with a laterally grown crystalline silicon film.

Furthermore, in a crystalline silicon TFT obtained by a conventional process of solid phase crystallization, a step of solid phase crystallization is effected at a maximum temperature of the process before carrying out the step of photolithography (isolation of devices on a silicon film). However, in a TFT using a laterally grown portion according to the technology disclosed in Japanese patent application No. 5-218156, a first step of photolithography (perforation of mask film to add impurity metal elements into the amorphous silicon film through the perforated holes) must be effected before the step of crystallization.

The most generally used 7059 glass (a product of Corning Corp.) undergoes deformation at a temperature of 593° C. Accordingly, it cannot resist to a conventional solid phase crystallization process without being deformed, because the process employs a temperature of 600° C. or higher. In particular, even larger displays are required in the present day liquid crystal display devices. Those devices keenly demand their implementation using larger glass substrates. If a step of photolithography should be effected on such large-area glass substrates before applying the step of thermal crystallization, shrinking and deformation which occur in a glass substrate during the step of thermal crystallization impair the precision in the later mask aligning step to occasionally make the fabrication unfeasible.

Figure 6:
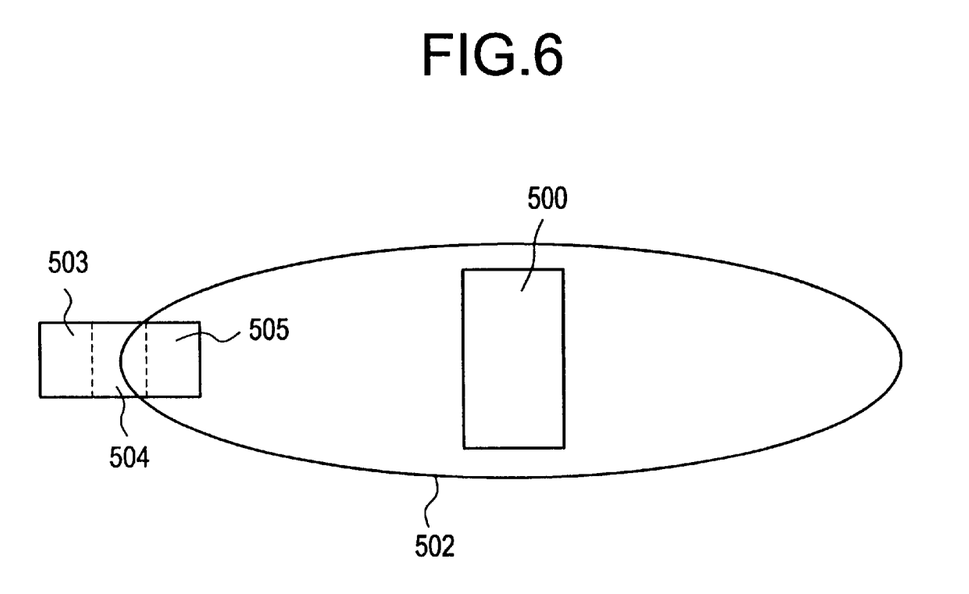
FIG. 6 is a planar view showing a relation between a lateral growth region and a device formation region in a semiconductor film.

That is, in accordance with the technology disclosed in Japanese patent application No. 5-218156 above, although a sufficiently long distance for lateral crystal growth as to cover the channel region of a TFT is obtained in some of the devices with reference to FIG. 6, there may be cases in some of the devices in which it is found impossible to form a channel region 504 in the laterally grown portion 502 due to the mismatch attributed to the shrinking of the substrate which occurs after the step of thermal crystallization. Furthermore, there are cases in which the channel region 504 is afforded by using the laterally grown portion 502, but in which the source/drain region 503/505 remain as they are in the state of amorphous silicon film due to the lateral growth which occurs over an insufficient length.

More specifically, a Corning 7059 glass shrinks at 200–400 ppm by subjecting it to a heat treatment at a temperature of 580° C. for a duration of 16 hours. In a square substrate 100 mm×100 mm in area, the absolute shrinkage is found to be in a range of from 20 to 40 $\mu$m. Thus, by extending the distance of lateral growth to a length of 40 $\mu$m or longer, a margin for the shrinkage of the glass substrate can be obtained. It is then possible to fabricate the channel region of a TFT in the laterally grown portion. In a square substrate 500 mm×500 mm in area, however, the absolute shrinkage amounts to fall in a range of from 100 to 200 $\mu$m. It can be readily understood that an a-Si obtained by a conventional plasma CVD process is no longer applicable as a starting film in case such a long shrinkage margin is required for lateral growth. Thus, it can be understood that even though a high performance TFT should be partly obtained by the technology disclosed in Japanese patent application No. 5-218156 alone, it is practically unfeasible to uniformly form high performance TFTs exhibiting the same characteristics over a large area substrate.

Furthermore, from the viewpoint of the object of effecting the lateral crystal growth, which is to make the crystals to grow in a single direction, it has been found difficult to obtain a high quality crystalline silicon film composed of one-dimensionally grown crystals when an a-Si film fabricated by plasma CVD process is used as the starting film. This is attributed to the branching in the direction of crystal growth that occurs due to the influence of the nuclei which generate inherently during the process of crystal growth.

This phenomena is particularly distinct when the heat treatment is effected at a temperature of about 600° C. or for a long duration enduring for several tens of hours with an aim to obtain a longer distance of lateral growth. That is, by increasing the length of lateral growth in an a-Si film obtained by plasma CVD having a high rate of nucleation, a plurality of branches are observed to occur at the front of the direction of crystal growth. Accordingly, a high quality crystalline silicon film as desired cannot be obtained in such cases.

Branching occurs in the laterally grown portions in the direction of crystal growth due to not only the nucleation in the a-Si region as described above, but also the presence of impurities such as oxygen, carbon, nitrogen, and other metallic elements that are incorporated in the a-Si film. Oxygen is particularly problematic, and if oxygen is incorporated at an amount higher than a certain content, defects generate from the oxygen clusters as to interfere the crystal growth. That is, residual oxygen inside an a-Si film hinders lateral growth as to induce branching. As described in *J. Appl. Phys.*, 68 (1990) p. 1029, a film deposited by plasma CVD process contains oxygen at a concentration as high as $3 \times 10^{19}$ cm$^{-3}$ or even higher, as well as carbon and nitrogen which amount to a relatively high concentration of $3 \times 10^{18}$ cm$^{-3}$ or higher and $1 \times 10^{18}$ cm$^{-3}$ or higher, respectively.

In the case of using a plasma CVD process, moreover, the metallic elements contained in the electrode are taken up by the film during the deposition thereof. Thus, the content of the impurity metal elements in the film becomes relatively high as compared with that in a film deposited by other thermal CVD processes. Thus, it can be understood that, if a film deposited by a plasma CVD process should be used as the starting film for a laterally grown crystalline silicon film, branching would occur with a higher probability from the viewpoint of impurity content thereof. Accordingly, it can be understood that a low quality crystalline silicon film containing crystal defects in a high concentration results from a film deposited by plasma CVD.

SUMMARY OF THE INVENTION

In the light of the aforementioned circumstances, it is an object of the present invention to form semiconductor devices by solving the problems above. According to the present invention, the process and the conditions for depositing the starting material, i.e., the amorphous silicon film, are optimized to considerably increase the distance of laterally grown portion. Thus, the instability in TFTs is eliminated by sufficiently increasing the distance of the lateral growth. The fabrication process for the TFT is simplified by increasing the margin in the mask alignment of the laterally grown portion to cancel out the influence of glass substrate shrinkage, and the crystallinity of the laterally grown portion is greatly improved by reducing the branching and the crystal defects in the direction of crystal growth.

Figure 7:
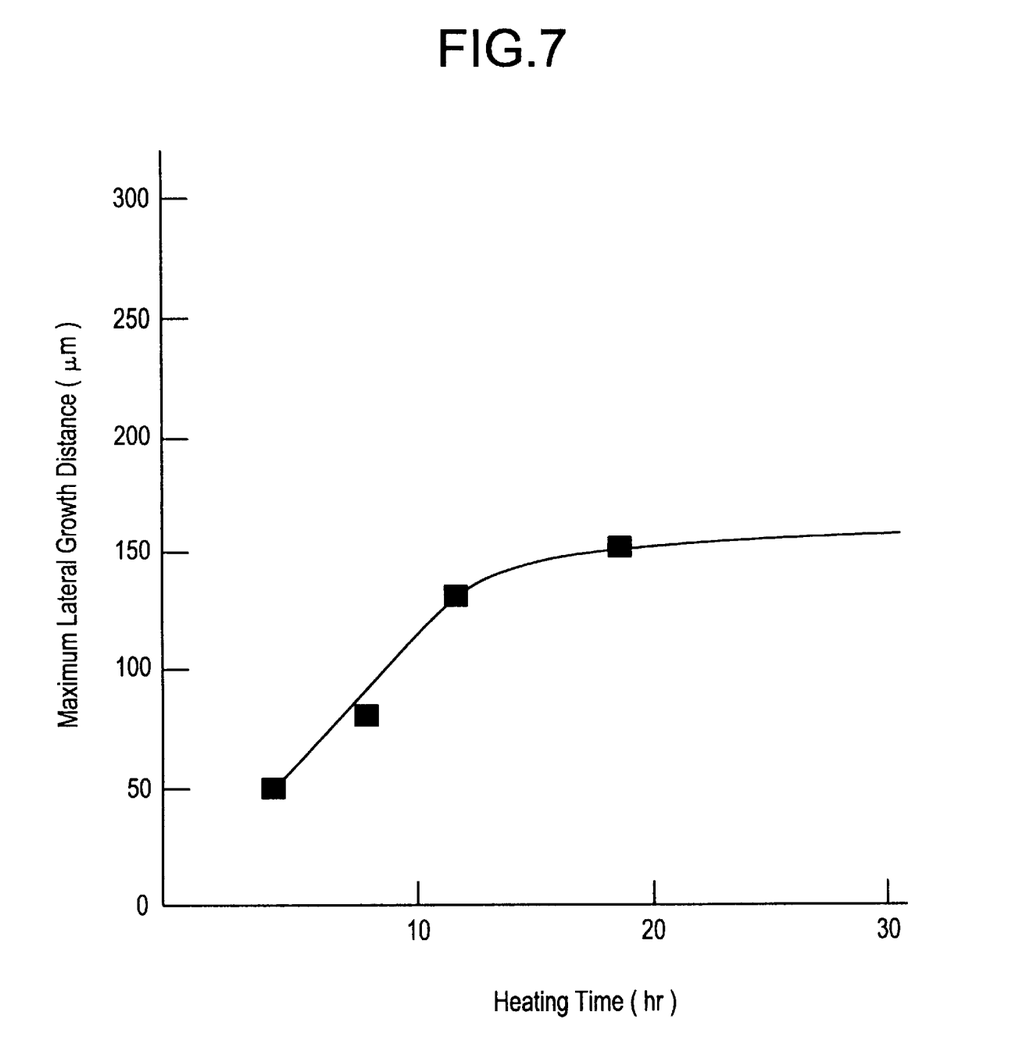
FIG. 7 is a graph showing the dependence of a grown distance on the duration of heating.
Figure 8:
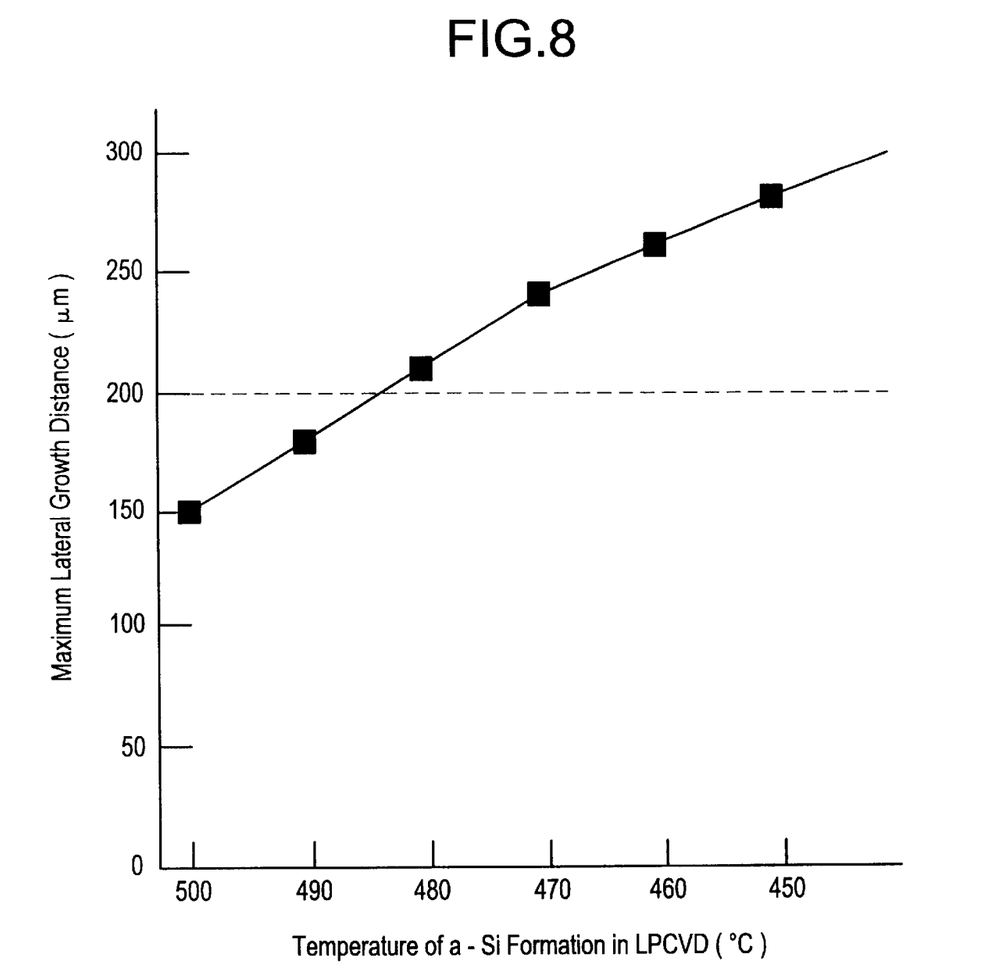
FIG. 8 is a graph showing a relation between a maximum lateral growth distance and a deposition temperature.
Figure 9:
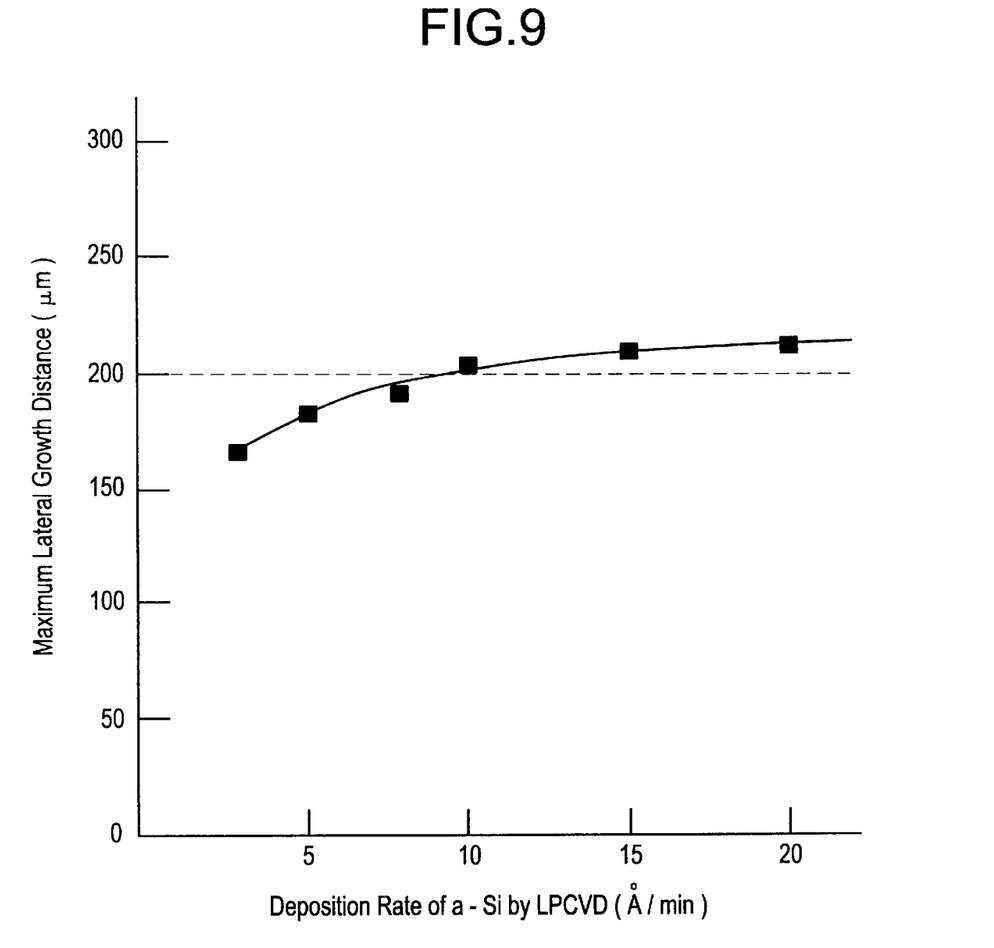
FIG. 9 is a graph showing a relation between a maximum lateral growth distance and a deposition rate.

The dependence of the distance of laterally grown portion in the starting amorphous silicon film was studied. Two types of amorphous silicon films, i.e., a type deposited by plasma CVD and a type deposited by reduced pressure CVD, were used. Furthermore, for the film deposited by reduced pressure CVD, the experiment was performed by varying the temperature and the film deposition rate. The results are shown in FIGS. 7, 8, and 9. The plots given in the graph shown in FIG. 7 represent the representative data obtained by laterally growing crystals at a temperature of 580° C. using an a-Si film deposited by plasma CVD as the starting film. In FIG. 7, the abscissa represents the duration of heating, and the ordinate represents the distance of the laterally grown portion measured from the edge of the region in which a metal element is added.

The growth rate in the laterally grown portion represented by the gradient of the curve depends on the heating temperature, and is higher for a higher temperature. It can be understood from FIG. 7 that the distance of the laterally grown portion increases linearly and at a constant rate with a laps of the heating time until a constant value in distance is attained. It is noted that the distance of laterally grown portion does not increase infinitely with increasing duration of heating, and that the distance of lateral growth saturates at a certain limit.

FIG. 8 shows the relation between the limit in the distance of the laterally grown portion grown at a heating temperature of 580° C. and the temperature of depositing the starting a-Si film by means of reduced pressure CVD. For reference, the maximum distance of lateral growth obtained for an a-Si film deposited by plasma CVD under the same conditions is indicated in the ordinate in FIG. 8 (shown by broken lines). FIG. 9 shows the relation between the maximum distance of lateral growth and the film deposition rate of an a-Si film in case of effecting reduced pressure CVD at 480° C. The heating temperature was set at 580° C. From FIGS. 8 and 9, it can be seen that the limit in the distance of laterally grown portion differs depending on the type of the starting amorphous silicon film and the conditions of film deposition, and that the limit distance of lateral growth can be increased by optimizing the type of the starting film and the film deposition conditions.

The distance of lateral growth becomes limited due to the solid phase crystallization phenomena based on natural nucleation which occurs in the region of amorphous silicon film other than the region into which a metallic element impurity is added. That is, during the progress of lateral growth from the region of low temperature crystallization into which metallic element is added, natural nucleation occurs in the rest of the amorphous silicon film as to cause collision between the laterally grown crystallized region and the region which underwent crystallization after natural nucleation. Consequently, the lateral growth is stopped by the collision. Thus, by lowering the rate of natural nucleation at the starting amorphous silicon film and by suppressing the occurrence of solid phase crystallization at regions other than the region into which metallic element impurity is added, the limit in the distance of laterally grown region can be increased.

The rate of natural nucleation is an intrinsic value for an amorphous silicon film, and it greatly varies depending on the method and the conditions of film deposition. In a film obtained by plasma CVD, impurity elements such as carbon, nitrogen, and particularly oxygen, are found to be present in a mixed state and at a relatively large quantity. Thus, these impurities function as foreign matter to cause natural nucleation. Moreover, since the films are deposited at a temperature 400° C. or lower, a large quantity of hydrogen is taken up by the film. Thus, on effecting thermal crystallization, hydrogen is driven off therefrom to produce the dangling bonds therein and deformation around the dangling bonds. As a result natural nuclei are readily produced. Concerning impurities, the quality of a film deposited by reduced pressure CVD is superior to that of a film obtained by plasma CVD, and, because the film is deposited at a temperature of 400° C. or higher in case of reduced pressure CVD, the hydrogen concentration is far lower than that of a film obtained by plasma CVD. However, an amorphous silicon film deposited at a temperature of about 500° C. or higher contains mixed therein a microcrystalline component at a relatively large quantity. Even in case of a film deposited at a temperature of 500° C. or lower, however, if the film is formed at a low deposition rate, the silicon atoms having a relatively weak bonding strength are reduced by hydrogen as to leave only the silicon atoms having a relatively high bonding strength. Then, the film results as to contain the microcrystalline component at a high quantity.

When using the laterally grown crystalline silicon film for the channel portion of a TFT, for instance, in a large-area square glass substrate about 500 mm×500 mm, a laterally grown distance of 200 µm is necessary as a shrinkage margin as described hereinbefore. With reference to FIGS. 8 and 9 obtained in accordance with the experiment above, an a-Si film formed by reduced pressure CVD is found suitable as a starting material for a lateral growth of such a long distance. Furthermore, favorable film can be obtained by deposition effected at a temperature of 480° C. or lower and at a film deposition rate of 10 Å/min or higher. By using the a-Si film deposited under the preferred conditions, the nucleation rate can be suppressed to $2 \times 10^8$ cm$^{-3}$s$^{-1}$ or lower. More preferably, by using an a-Si film deposited at a temperature of 460° C. or lower and at a film deposition rate of 25 Å/min or higher, the nucleation rate can be further suppressed to $1 \times 10^8$ cm$^{-3}$s$^{-1}$ or lower, and a laterally grown distance as long as 250 µm, or even longer, can be obtained. However, the use of a higher order silane-based gas expressed by $Si_nH_{2n+2}$ (where n is 2 or more) is indispensable to fulfill the above conditions. It is impossible to satisfy the film deposition conditions above by using monosilane ($SiH_4$). Thus, by using an a-Si film deposited by a reduced pressure CVD under the specific conditions described above as the starting material, a lateral growth exceeding a distance of 200 µm can be achieved.

To increase the crystallinity of the laterally grown portions, it is indispensable to reduce the concentration of impurities incorporated in the a-Si film, particularly that of oxygen. It is known in general that, if incorporated singly, an oxygen atom cannot form a defect by itself and disappears, but that minute defects generate from an oxygen cluster composed of several atoms. In a polycrystalline film of silicon, oxygen atoms are found segregated in the grain boundary portion. Also in the laterally grown portion, the oxygen atoms are found to be segregated in the grain boundary of the needle-like crystals aligned in one direction. In a laterally grown portion, the problem of branching is attributed to the defects formed by the oxygen clusters alone. Thus, by controlling the oxygen concentration of the a-Si film before crystallization to $5 \times 10^{18}$ cm$^{-3}$ or lower, branching in the direction of crystal growth which occurs due to minute defects which generate oxygen clusters within a distance of lateral growth of 200 µm can be almost completely eliminated.

Two methods, i.e., a method of increasing the degree of vacuum before depositing the a-Si film and thereby reducing the concentration of residual oxygen inside the apparatus, and a method of introducing gaseous hydrogen or an inert gas such as helium before introducing a precursor gas, can be mentioned as a means for suppressing the oxygen concentration in an a-Si film fabricated by reduced pressure CVD to a level below the aforementioned concentration. To achieve an oxygen concentration of $5 \times 10^{18}$ cm$^{-3}$ or lower in an a-Si film by the former method, a high degree of vacuum with a pressure of $8 \times 10^{-3}$ Pa or lower is necessary. By using the both methods, the oxygen concentration of the a-Si film can be reduced more efficiently.

Thus, by fabricating a TFT by using an elongated laterally grown portion according to the present invention as mentioned in the foregoing, not only the problems of the process concerning the shrinking in substrates can be overcome, but also a high quality laterally grown crystalline silicon film composed of crystallites whose direction of crystal growth is aligned in a single direction can be obtained. Furthermore, improved TFT characteristics and uniformity can be achieved, because the present invention allows a plurality of TFTs to be fabricated in a single laterally grown portion.

In fabricating a TFT using a crystalline silicon film grown in the direction parallel to the surface of the substrate, the distance of growth can be increased by using the a-Si film fabricated by reduced pressure CVD as the starting material. As a result, a TFT with an improved and stabilized characteristics can be obtained to facilitate the process steps for the fabrication of TFTs.

Furthermore, by depositing the a-Si film by reduced pressure CVD at a film deposition temperature of 480° C. or lower and at a film deposition rate of 10 Å/min or higher to control the rate of crystal nucleation within the a-Si region to $2 \times 10^8$ cm$^{-3}$s$^{-1}$ or lower, the distance of lateral growth can be extended to 200 µm or even longer. This enables the fabrication of a plurality of TFTs in a single laterally grown portion. In effecting the film deposition under the conditions above, the use of a higher order silane-based gas expressed by $Si_nH_{2n+2}$ (where n is 2 or more) is indispensable.

Furthermore, by attaining a degree of vacuum of $8 \times 10^{-3}$ Pa or lower before depositing the a-Si film, and by introducing an inert gas before the deposition of the film and subsequently introducing a gas for film deposition, the oxygen concentration inside the a-Si film can be lowered to $5 \times 10^{18}$ cm$^{-3}$ or lower, and the branching in the direction of crystal growth which occurs within the region of lateral crystal growth due to cluster defects can be suppressed. Thus, by reducing the oxygen concentration in the starting a-Si film and by lowering the rate of natural nucleation, a laterally grown portion silicon film improved in quality can be obtained. By then fabricating a TFT using the laterally grown silicon film, a semiconductor device comprising a substrate with a high-performance TFT having stable characteristics provided on the entire surface thereof can be implemented.

Furthermore, by arranging source and drain regions in the direction along the crystal growth direction, a TFT with carriers whose movement is less influenced by the grain boundaries, i.e., a TFT having a high mobility, can be obtained. Also, by arranging source and drain regions in a direction perpendicular to the crystal growth direction, a continuous grain boundary portion in the direction of a carrier movement can be eliminated from the region of drain edge at which electric field concentration occurs. Thus, a TFT having low OFF current can be obtained.

DETAILED DESCRIPTION OF THE PREFERRED EMBODIMENTS

The present invention is described in further detail referring to non-limiting preferred embodiments below.

EXAMPLE 1

According to an embodiment of the present invention, the present example provides a process for fabricating a circuit suitable for use in a driver circuit and the like of a liquid crystal display device, having a CMOS configuration comprising an NTFT and a PTFT arranged in a complementary structure. The present example comprises forming a TFT of the CMOS structure on an insulating substrate (e.g., a glass substrate). A crystalline silicon film grown in a direction parallel with the substrate is used as the semiconductor film constituting the TFT, so that the direction of the carrier movement during the operation of the TFT may be in a direction parallel with the direction of crystal growth.

Figure 1:
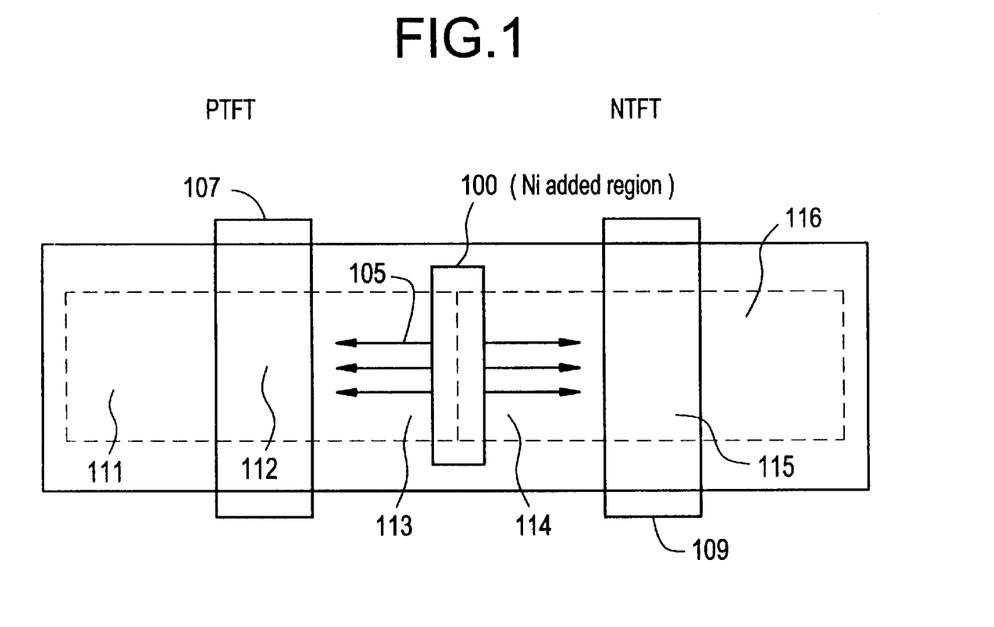
FIG. 1 is a planar view of a semiconductor device according to a first embodiment of the present invention.

FIG. 1 shows the planar view of a circuit to which the present invention is applied, and it comprises an NTFT and a PTFT provided in a complementary arrangement. FIGS. 2(A) to 2(D) show manufacturing steps of the semiconductor device.

Figure 2A:
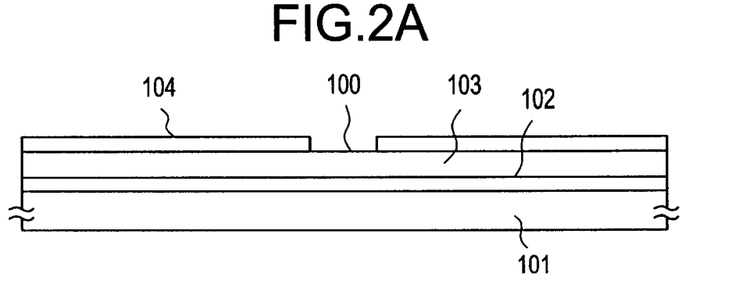
FIGS. 2(A) to 2(D) are cross sectional views for showing a manufacturing method in accordance with a first embodiment of the present invention.

A 2,000 Å thick base film 102 of silicon oxide is formed on a glass substrate 101 by means of sputtering. Then, by reduced pressure CVD, a 500 to 1,500 Å thick amorphous silicon film, e.g., a 1,000 Å thick intrinsic (I-type) amorphous silicon (a-Si) film 103 is deposited thereon using a higher order silane-based gas expressed by $Si_nH_{2n+2}$ (where n is 2 or more). The low temperature reactivity of the gas increases with increasing n, and the film deposition rate increases accordingly.

However, such gases with high n become very expensive and is not readily available. In the present example, a most generally used higher order silane based gas, e.g. disilane ($Si_2H_6$) gas is used for the film deposition. Furthermore, although an effect desired by the present invention is available by depositing the film at a film deposition temperature of 480° C. or lower and at a film deposition rate of 10 Å/min or higher, a more preferred effect can be obtained by depositing the film at a temperature of 460° C. or lower and at a deposition rate of 25 Å/min or higher. Considering the use of an $Si_2H_6$, a film deposition temperature of 450° C. and a rate of 35 Å/min are employed specifically in the present example as optimal conditions.

A mask 104 is then formed by using, for example, a silicon oxide film or a silicon nitride film. By using the mask 104, an a-Si film 103 is exposed in the form of slits. That is, upon observing the state illustrated in FIG. 2(A) from the upper side, the a-Si film 103 can be found exposed in the form of a slit 100 while the rest of the portions remain masked.

After providing the mask 104 above, a film of nickel silicide (expressed by a chemical formula of $NiSi_x$, with x being 0.4 or more and 2.5 or less; for instance, x is 2.0) from 5 to 200 Å in thickness, for instance, a nickel silicide film 20 Å in thickness, is deposited by sputtering. By removing the mask 104 thereafter, a thin film of nickel silicide is formed selectively on the portion of the region 100. That is, nickel is added selectively in a trace amount to the portion of the region 100. The thin film of nickel silicide is annealed at 550° C. for 16 hours under a reducing atmosphere of gaseous hydrogen (preferably at a hydrogen partial pressure in a range of from 0.1 to 1 atm), or under an inert gas atmosphere (1 atm).

Figure 2B:
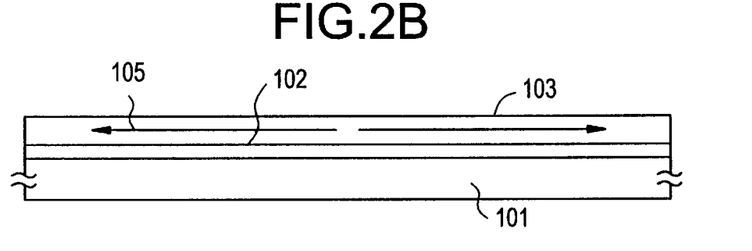

With reference to FIGS. 1 and 2(B), the silicon film 103 undergoes crystallization in a direction perpendicular to the substrate 101 in the region 100 on which a nickel silicide film is deposited selectively. In the periphery of the region 100, as indicated with an arrow 105, crystals grow in a lateral direction from the region 100 (i.e., in a direction parallel with the substrate). Then, as is shown clearly in the later steps, source and drain regions are formed in the direction of crystal growth. The distance of the crystal growth which occurs in parallel with the substrate is about 100 μm.

As a result of the steps above, a crystalline silicon film 103 can be obtained by crystallizing the amorphous silicon film. The device regions are formed thereafter by effecting isolation and removing crystalline silicon film 103 from the unnecessary portions. By setting the length of the active layer (i.e., source and drain regions, a portion in which a channel forming region is formed) of the TFT to within 30 μm, a margin of 70 μm can be obtained by forming the active layer with a crystalline silicon film. By taking the shrinkage of the glass substrate after the heat treatment into consideration, the margin has a great significance. In case of using a 30 cm square glass substrate or a larger substrate, the channel region of the TFT can be formed in the laterally grown portion over the entire substrate. Furthermore, because the distance of the laterally grown portion increases by extending the duration of annealing, the influence of substrate shrinking can be canceled out in case a glass substrate larger in area is used.

Thereafter, a 1,000 Å thick silicon oxide film 106 is deposited by sputtering as a gate insulating film. The sputtering process is effected under a gaseous atmosphere of oxygen and argon mixed at a ratio of argon to oxygen in a range of from 0 to 0.5, for instance at 0.1 or lower, while maintaining the temperature of the substrate in a range of from 200 to 400° C., for instance, at 350° C., and by using silicon oxide as the target. Then, an aluminum film containing from 0.1 to 2% of silicon is deposited by sputtering to a thickness in a range of from 4,000 to 8,000 Å, for instance, at a thickness of 6,000 Å.

The resulting aluminum film is patterned thereafter to form gate electrodes 107 and 109. Then, by anodically oxidizing the surface of the resulting aluminum electrodes, oxide layers 108 and 110 are formed on the surface of the electrodes. The anodic oxidation is performed in an ethylene glycol solution containing from 1 to 5% of tartaric acid. The thickness of the oxide layers 108 and 110 thus obtained is 200 Å. Because the offset gate regions are formed in the later step of ion doping depending on the oxide layers 108 and 110, the length of the offset gate region can be determined by the step of anodic oxidation above.

Then, by ion doping, impurities (phosphorus and boron) are implanted into the active region by using the gate electrode 107 and the peripheral oxide layer 108, as well as the gate electrode 109 and the peripheral oxide layer 110 as a mask. Phosphine ($PH_3$) and diborane ($B_2H_6$) are used as the doping gases. The dose of the impurities is in a range of from $1 \times 10^{15}$ to $8 \times 10^{15}$ $cm^{-2}$. Specifically, phosphine is used as the doping gas, phosphorus is introduced at a dose of $2 \times 10^{15}$ $cm^{-2}$ with an accelerating voltage of from 60 to 90 kV, for example, a voltage of 80 kV. When diborane is used, boron is introduced at a dose of, for example, $5 \times 10^{15}$ $cm^{-2}$, by applying an accelerating voltage of from 40 to 80 kV, for instance, a voltage of 65 kV. The gate electrodes 107 and 109, and the peripheral oxide layers 108 and 110 function as masks to provide impurity non-doped regions 112 and 115 which later function as channel regions. The regions are each selectively doped with the element by covering the other region with a photoresist. Thus are obtained N-type impurity regions 114 and 116 for an N-TFT, as well as P-type impurity regions 111 and 113 fora PTFT.

Figure 2C:
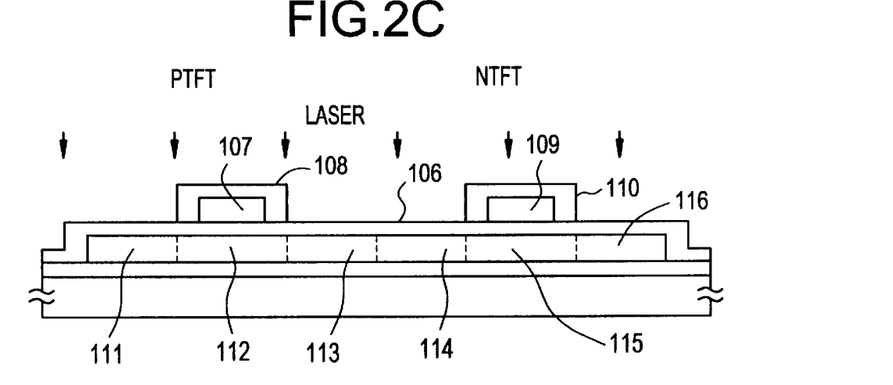

The semiconductor layers are then annealed by irradiating a laser beam as shown in FIG. 2(C). A KrF excimer laser operating at a wavelength of 248 nm and at a pulse width of 20 nsec is used in the present invention. However, the type of the laser for use in the process is not only limited thereto, and any other type of laser can be used as well. The laser beam is irradiated from 2 to 10 shots per site, for example, 2 shots per site, at an energy density of from 200 to 400 $mJ/cm^2$, for instance, at 250 $mJ/cm^2$. The effect of laser annealing can be further enhanced by heating the substrate in the temperature range of from about 200 to 450° C. Because the region annealed previously contains nickel atoms diffused therein, recrystallization easily proceeds therein by irradiating a laser beam. The impurity regions 111 and 113 doped with an impurity which imparts a P-type conductivity to the region, as well as the impurity regions 114 and 116 doped with an impurity which imparts an N-type conductivity can be readily activated by irradiating the laser beam.

Figure 2D:
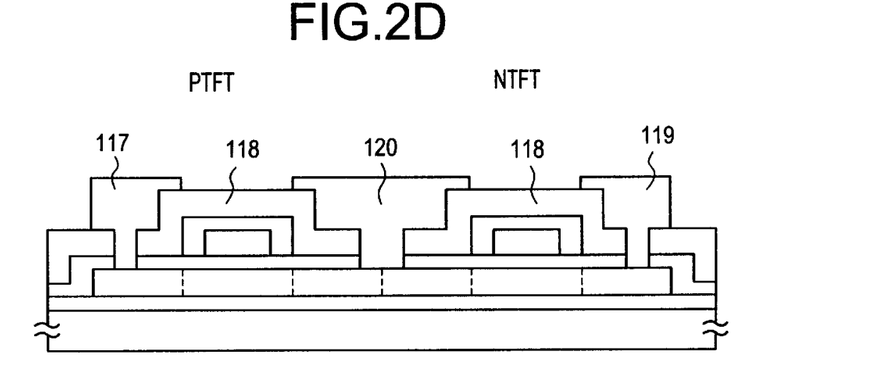

Then, as shown in FIG. 2(D), a 6,000 Å thick silicon oxide film 118 is formed as an interlayer dielectric by plasma-assisted CVD. By forming contact holes therein, electrodes with interconnection 117, 120, and 119 for the TFT can be provided by using a metallic material, for example, a multilayered film of titanium nitride and aluminum. A semiconductor circuit comprising the TFTs in a complementary arrangement is obtained by finally annealing the structure at a temperature of 350° C. for a duration of 30 minutes under a gaseous hydrogen atmosphere at a pressure of 1 atm.

In the constitution illustrated in FIGS. 2(A) to 2(D), the positional relation between the region into which nickel is introduced selectively and the TFT is described referring to FIG. 1. Referring to FIG. 1, a trace quantity of nickel is added selectively into the region 100, and by thermal annealing, crystal growth occurs in the lateral direction (directions to the right and the left of the paper) indicated with an arrow 105 in the figure. In the present invention, a specific a-Si film suppressed in the rate of natural nucleation is used in order to not only greatly increase the direction of lateral growth, but also to improve the crystallinity of the laterally grown portions. Thus, a high quality laterally grown crystalline film of silicon can be formed over the entire surface of a large area substrate by using a simple process. Then, in the region in which a lateral crystal growth is effected, source and drain 111 and 113, as well as a channel forming region 112 are formed as a P-TFT while source/drain regions 114 and 116, as well as a channel forming region 115 are formed as an NTFT. A particularly high mobility can be obtained, because since the direction of carrier movement between the source and the drain corresponds to the direction 105 of crystal growth, carriers can move without crossing the grain boundary.

The circuit thus obtained comprises a PTFT and an NTFT provided in a complementary arrangement, however, it is also possible to fabricate two independent TFTs by forming two TFTs simultaneously according to the process steps above, and separating them at the center.

EXAMPLE 2

The present example relates to a process for fabricating an NTFT which provides a pixel switching element of a liquid crystal display device. In a pixel switching element of a liquid crystal display device, the reduction of a leak current during the OFF state of a TFT is required from the viewpoint of maintaining the written signal (charge). The present example more specifically relates to a case of forming an NTFT on an insulating substrate (e.g., a glass substrate), and a crystalline silicon film comprising crystals grown in the direction parallel with the substrate is used as the semiconductor film constituting the TFT. By taking this constitution, the direction of the carrier movement can be set perpendicular to the direction of the crystal growth within the crystalline film.

Figure 3:
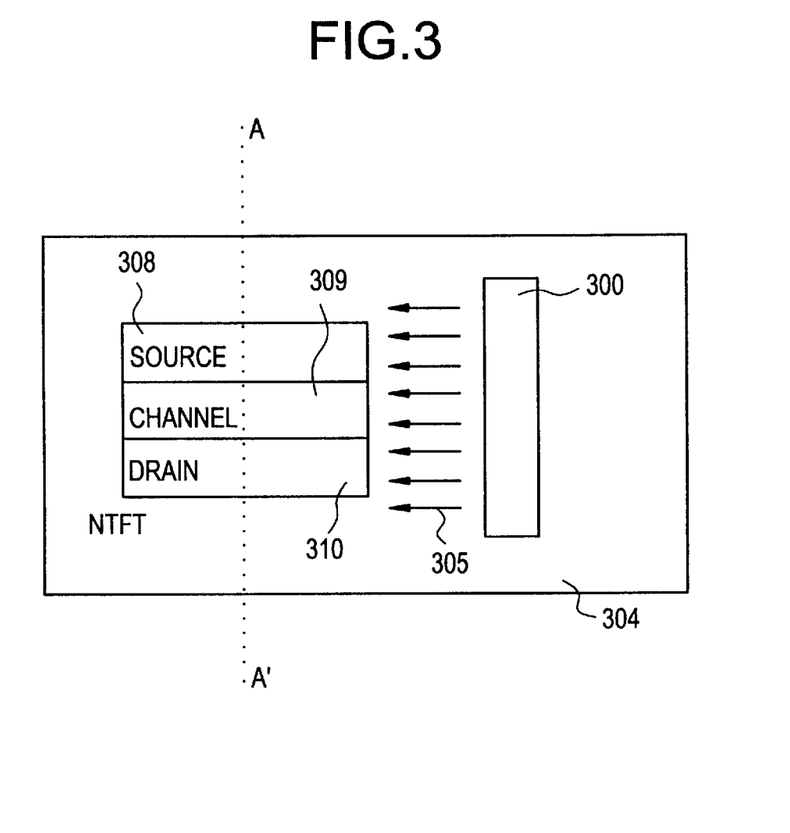
FIG. 3 is a planar view of a semiconductor device according to a second embodiment of the present invention.

FIG. 3 shows schematically a planar view of an NTFT which constitutes a pixel switching element, in which the present invention is applied. Similar to the case above, the steps of fabrication proceed sequentially in the order shown in the cross sectional views FIGS. 4(A) to 4(D).

Figure 4A:
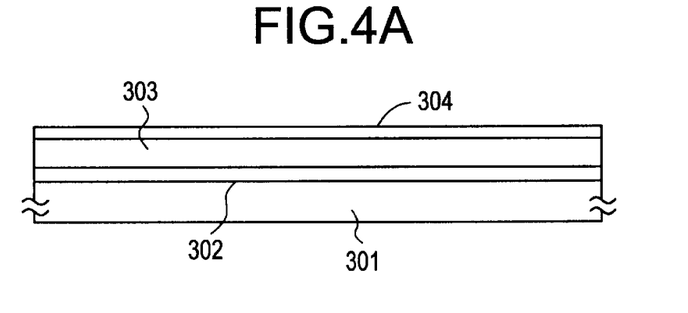
FIGS. 4(A) to 4(D) are cross sectional views for showing a manufacturing method in accordance with a second embodiment of the present invention.

A 2,000 Å thick base film 302 of silicon oxide is formed on a glass substrate 301 by means of sputtering. Then, by reduced pressure CVD, a 500 to 1,500 Å thick amorphous silicon film, e.g., a 800 Å thick intrinsic (I-type) amorphous silicon (a-Si) film 303 is deposited thereon. In the present example, the deposition is effected using disilane ($Si_2H_6$) gas at a film deposition temperature of 460° C. and at a film deposition rate of 25 Å/min.

Figure 4B:
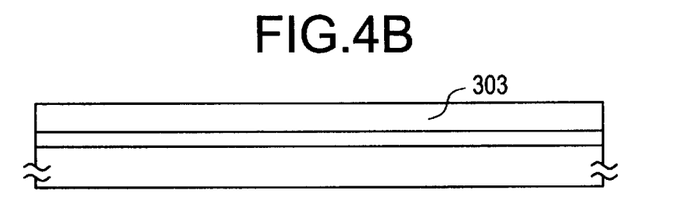
Figure 4C:
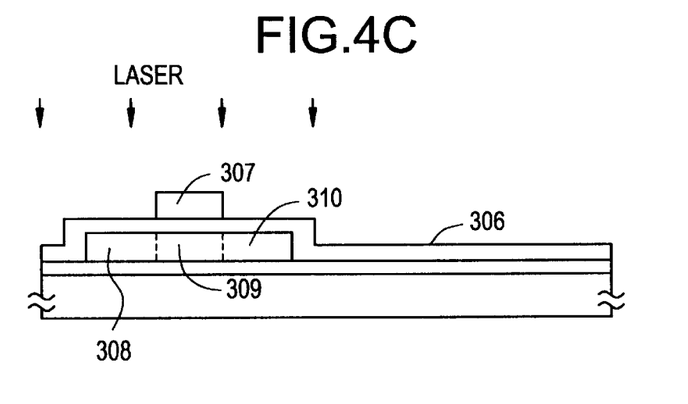
Figure 4D:
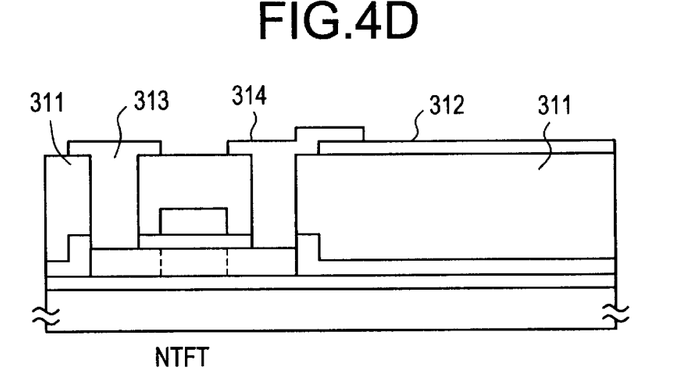

A mask 304 is then formed by using, for example, a silicon oxide film or a silicon nitride film. By using the mask 304, an a-Si film 303 is exposed in the form of a slit. That is, upon observing the state illustrated in FIG. 4(A) from the upper side, the a-Si film 303 can be found exposed in the form of a slit 300 on the surface side or the back side of the drawing sheet, while the rest of the portions remain masked. A cross section obtained by cutting the structure in FIG. 3 with a line A—A' correspond to the structure illustrated in FIG. 4(C) or FIG. 4(D). In FIGS. 4(C) and 4(D), source and drain regions are enumerated 308 and 310, and the channel region is indicated by numeral 309.

After providing the mask 304 above, an aqueous solution of a nickel salt such as nickel acetate or nickel nitrate is applied over the entire surface of the substrate, and is dried uniformly by means of a spinner. The aqueous solution for use herein preferably contains nickel at a concentration of from 50 to 200 ppm, and more preferably, it contains nickel at a concentration of 100 ppm. In the region 300, the Ni ions precipitated from the solution is brought into contact with the a-Si film as to selectively add nickel in a trace quantity. Crystallization can be effected by annealing the structure at 550° C. for a duration of 16 hours under a reducing atmosphere of gaseous hydrogen (preferably at a hydrogen partial pressure in a range of from 0.1 to 1 atm), or under an inert gas atmosphere (1 atm).

With reference to FIG. 3, the region 300 into which nickel is added in a trace quantity undergoes crystallization in a direction perpendicular to the substrate 301. In the periphery of the region 300, as indicated with an arrow 305, crystals grow in a lateral direction from the region 300 (i.e., in a direction parallel with the substrate). Then, as is shown clearly in FIG. 3, the line connecting source and drain regions crosses with the direction 305 or crystal growth. Considering the grown crystals, the distance of crystal growth which occurs in parallel with the substrate is about 100 $\mu$m.

As a result of the steps above, a crystalline silicon film 303 can be obtained by crystallizing the amorphous silicon film. Then, after removing the mask 304, element regions are formed thereafter by effecting isolation and removing the crystalline silicon film 303 from the unnecessary portions. By setting the width of the active layer (i.e., source and drain regions, and a channel region) of the TFT to within 30 $\mu$m, a margin of 70 $\mu$m can be obtained for the mask alignment. By taking the shrinkage of the glass substrate after the heat treatment into consideration, the margin has a great significance. In case of using a 30 cm square glass substrate or a larger substrate, the channel region of the TFT can be formed in the laterally grown portion over the entire substrate. Furthermore, because the distance of the laterally grown portion increases by extending the duration of annealing, the influence of substrate shrinking can be canceled out in case a glass substrate larger in area is used.

Thereafter, a 1,000 Å thick silicon oxide film 306 is deposited by atmospheric pressure CVD as a gate insulating film. The sputtering process is effected preferably by maintaining the temperature of the substrate at about 400° C. However, to improve the bulk characteristics of the gate insulating film itself and the grain boundary characteristics in the crystalline silicon film and gate insulating film, an annealing is preferably effected at about 550° C. under an inert gas atmosphere. Then, an aluminum film containing from 0.1 to 2% of silicon is deposited by sputtering to a thickness in a range of from 4,000 to 8,000 Å, for instance, at a thickness of 6,000 Å.

The resulting aluminum film is patterned thereafter to form a gate electrode 307. Then, after implanting an impurity (phosphorus) into the active region by means of ion doping using the gate electrode 307 as a mask, a region 309 masked by the gate electrode 307 and thereby containing no impurity implanted therein can be obtained as a channel region in the later TFT. The regions implanted with an impurity serve as a source region 308 and a drain region 310 of the TFT in the later steps.

As shown in FIG. 4(C), the ion-implanted impurity is activated by annealing, more specifically, by irradiating a laser beam. Because the region annealed previously contains nickel atoms diffused therein, recrystallization easily proceeds therein by irradiating a laser beam. The impurity regions 308 and 310 doped with an impurity can be readily activated by irradiating a laser beam.

Then, as shown in FIG. 4(D), a 6,000 Å thick silicon oxide film 311 is formed as an interlayer dielectric by plasma-assisted CVD, and an ITO electrode 312 is formed thereafter to provide a pixel electrode. By forming contact holes in the interlayer dielectric film 311, electrodes with interconnection 313 and 314 for the TFT can be provided by using a metallic material, for example, a multilayered film of titanium nitride and aluminum. A complete TFT is obtained by finally annealing the structure at a temperature of 350° C. for a duration of 30 minutes under a gaseous hydrogen atmosphere at a pressure of 1 atm.

Referring to FIG. 3, the NTFT formed in accordance with FIGS. 4(A) to 4(D) comprises carriers moving between the source and drain regions 308 and 310 in a direction perpendicular to that of the direction 305 of crystal growth. Thus, the carriers must move by crossing a plurality of grain boundaries. Moreover, in such a case, the grain boundaries are found discontinuous in the direction of the carrier movement. Because the OFF current is believed attributed to the presence of carriers which move along the grain boundaries, the number of carriers moving along the grain boundaries can be decreased. Thus, a low OFF current can be achieved.

Furthermore, in the constitution above, the carriers must move crossing the grain boundaries. Accordingly, the resistance between source and drain increases as to lower both of the ON current and the OFF current. However, because the absolute value of the OFF current can be minimized, the function of the pixel electrode (corresponding to the ITO electrode 312 shown in FIG. 4(D)) for retaining charges can be improved. Thus, if a necessary ON/OFF ratio is achieved, a thin film transistor having a low OFF current can be implemented. Thus, because the OFF current can be minimized by two reasons in the TFT above, a constitution with reference to FIG. 3 as well as to FIGS. 4(A) to 4(D), which comprises the TFT having a low OFF current, is particular useful for improving the function of retaining charges within the pixels.

EXAMPLE 3

The present example relates to a process for fabricating a TFT by using a means of reducing the oxygen concentration together with the process described above in Example 2.

Referring first to FIG. 4(A), after forming a base film 302 of silicon oxide on a glass substrate 301, a 500 to 1,500 Å thick amorphous silicon film, e.g., a 800 Å thick intrinsic (I-type) amorphous silicon (a-Si) film 303 is deposited thereon by reduced pressure CVD. Prior to the deposition, the film deposition chamber is first evacuated until a vacuum degree of $8\times10^{-3}$ Pa or less, preferably, $2\times10^{-3}$ Pa or less, is achieved, and then, an inert gas, e.g., a helium gas, is introduced into the chamber. In this case, the helium gas is introduced at a pressure of about 10 Pa and for a duration necessary to sufficiently replace the residual oxygen in the chamber with helium, more specifically, for a duration of about 10 minutes. Then, the flow rate of the helium gas is gradually lowered to transfer the atmosphere to gaseous $Si_2H_6$. Thus, the film is deposited at temperature of 460° C. and at a film deposition rate of 25 Å/min. The a-Si film thus deposited is found to contain oxygen at a concentration of $5\times10^{18}$ cm$^{-3}$ or less, and by further reducing the leakage of the LPCVD apparatus, a lower oxygen concentration of $1\times10^{18}$ cm$^{-3}$ or less can be achieved.

A mask 304 is then formed by using, for example, a silicon oxide film or a silicon nitride film. By using the mask 304, an a-Si film 303 is exposed in the form of a slit to selectively add nickel at a trace amount to the portion 300.

The resulting structure is then annealed at about 550° C. under an inert gas atmosphere for a duration of 16 hours to crystallize the amorphous silicon film. A complete TFT can be obtained by the same process steps as those described in Example 2.

In the aforementioned three examples, nickel is introduced by selectively forming a thin film of nickel (however, because it is provided extremely thinly, is difficult to observe it) on the surface of the amorphous silicon film 103 and 303, and crystals are allowed to grow therefrom. Otherwise, nickel may be added in a trace quantity to the surface of the base film 102 and 302 before depositing the amorphous silicon film 103 and 303. That is, the crystals are allowed to grow from either the upper side or the lower side of the amorphous silicon film. Furthermore, nickel may be added by means of ion doping, so that nickel ions may be selectively implanted into the amorphous silicon film. Such a case is advantageous in that the concentration of nickel element can be accurately controlled. Instead of depositing a thin film of nickel, a nickel electrode can be used to add a trace quantity of nickel by plasma treatment. Furthermore, not only nickel, but also cobalt, palladium, and platinum provides a similar effect.

The present invention has been described in detail with reference to three examples above. However, the present invention is not only limited thereto, and various modifications can be made based on the technological idea of the present invention. The present invention is applicable to, for instance, a contact image sensor, a thermal head having an embedded driver, an optical writing device and a display device having an embedded driver and an organic EL (electro-luminescent) element as the light-emitting element, a three dimensional IC, etc. High performance elements improved in speed, resolution power, etc., can be implemented by utilizing the constitution of the present invention. The present invention is not only limited to the MOS transistors described in the foregoing, but also is widely applicable to semiconductor processes using crystalline semiconductor, inclusive of those for bipolar transistors and static induction transistors.

In a process for fabricating a semiconductor device utilizing a crystalline semiconductor film using crystals grown in a direction in parallel with the substrate, the process of the present invention enables a considerably longer distance for a laterally grown region by fabricating the starting amorphous silicon film according to a reduced pressure CVD, and by furthermore reducing the oxygen concentration of the film through the optimization of the film deposition conditions therefor. Accordingly, the use of the laterally grown silicon film allows a more easier fabrication for a semiconductor device using the same, and it also allows the use of a glass substrate having a larger area. The laterally grown silicon film obtainable by the present invention is obtained from a starting film further reduced in the natural nucleation rate and in the concentration of defects attributed to impurity oxygen. Thus, because the direction of crystal growth is arranged almost completely in one dimension, a high quality laterally grown crystalline silicon film can be obtained. By furthermore fabricating a thin film transistor using the laterally grown crystalline silicon film, a semiconductor device comprising a high performance thin film transistor capable of stable operation can be implemented.

The present invention also enables a structure suitable for a device of high speed operation by fabricating a thin film transistor in such a manner that the direction of crystal growth may be in parallel with that of the movement of the carriers. In a device in which low OFF current is required, the thin film transistor is fabricated in such a constitution that the direction of crystal growth may be perpendicular to that of the movement of the carriers. Accordingly, it is also possible to fabricate a plurality of thin films each differing in characteristics depending on the purpose of their use.

While the invention has been described in detail and with reference to specific embodiments thereof, it will be apparent to one skilled in the art that various changes and modifications can be made therein without departing from the spirit and scope thereof.

What is claimed is:

1. A method of manufacturing a thin film transistor comprising the steps of:

forming a substantially amorphous silicon film by LPCVD over a substrate;

providing a selected portion of said amorphous silicon film with a metal element for promoting crystallization of said amorphous silicon film;

heating said amorphous silicon film provided with said metal element in order to crystallize said film wherein crystals grow in a direction parallel with a surface of said substrate in a region of said silicon film adjacent to said selected portion; and forming the thin film transistor by utilizing said region of the silicon film in which crystals grew parallel with the surface of the substrate, wherein a precursor gas used for forming said amorphous silicon film comprises silane expressed by a formula $Si_nH_{2n+2}$ where n>2.

2. The method of claim 1 wherein said amorphous silicon film is formed by the LPCVD at a temperature of 480° C. or lower.

3. The method of claim 1 wherein said amorphous silicon film is formed at a deposition rate of 10 Å/min or higher.

4. The method of claim 1 further comprising the step of evacuating a reaction chamber to a pressure of $8 \times 10^{-3}$ Pa or lower pressure prior to forming said amorphous silicon film therein.

5. The method of claim 1 further comprising the step of introducing an inert gas into a chamber and then introducing said silane therein, following which said amorphous silicon film is formed in said chamber.

6. The method of claim 1 wherein said metal element is selected from the group consisting of Ni, Co, Pd, and Pt.

7. The method of claim 1 wherein said thin film transistor is arranged so that a direction in which carriers of said transistor flow is approximately parallel with the crystal growth direction of said crystals.

8. The method of claim 7 wherein said amorphous silicon film is formed by the LPCVD at a temperature of 480° C. or lower.

9. The method of claim 7 wherein said amorphous silicon film is formed at a deposition rate of 10 Å/min or higher.

10. The method of claim 7 further comprising the step of evacuating a reaction chamber to a pressure of $8 \times 10^{-3}$ Pa or lower pressure prior to forming said amorphous silicon film therein.

11. The method of claim 7 further comprising the step of introducing an inert gas into a chamber and then introducing said silane therein, following which said amorphous silicon film is formed in said chamber.

12. The method of claim 7 wherein said metal element is selected from the group consisting of Ni, Co, Pd, and Pt.

13. The method of claim 1 wherein said thin film transistor is arranged so that a direction in which carriers of said transistor flow is approximately perpendicular to the crystal growth direction of said crystals.

14. The method of claim 13 wherein said amorphous silicon film is formed by the LPCVD at a temperature of 480° C. or lower.

15. The method of claim 13 wherein said amorphous silicon film is formed at a deposition rate of 10 Å/min or higher.

16. The method of claim 13 further comprising the step of evacuating a reaction chamber to a pressure of $8\times10^{-3}$ Pa or lower pressure prior to forming said amorphous silicon film therein.

17. The method of claim 13 further comprising the step of introducing an inert gas into a chamber and then introducing said silane therein, following which said amorphous silicon film is formed in said chamber.

18. The method of claim 13 wherein said metal element is selected from the group consisting of Ni, Co, Pd, and Pt.

19. A method of manufacturing a thin film transistor comprising the steps of:

forming a substantially amorphous silicon film by LPCVD over a substrate;

providing a selected portion of said amorphous silicon film with a metal element for promoting crystallization of said amorphous silicon film;

heating said amorphous silicon film provided with said metal element in order to crystallize said film wherein crystals grow in a direction parallel with a surface of said substrate in a region of said silicon film adjacent to said selected portion; and forming the thin film transistor by utilizing said region of the silicon film in which crystals grew parallel with the surface of the substrate, wherein said amorphous silicon film is formed at a temperature not higher than 480° C., and wherein a precursor gas used for forming said amorphous silicon film comprises silane expressed by a formula $Si_nH_{2n+2}$ where $n \geq 2$.

20. A method of manufacturing a thin film transistor comprising the steps of:

forming a substantially amorphous silicon film by LPCVD over a substrate;

providing a selected portion of said amorphous silicon film with a metal element for promoting crystallization of said amorphous silicon film;

heating said amorphous silicon film provided with said metal element in order to crystallize said film wherein crystals grow in a direction parallel with a surface of said substrate in a region of said silicon film adjacent to said selected portion; and forming the thin film transistor by utilizing said region of the silicon film in which crystals grew parallel with the surface of the substrate, wherein said amorphous silicon film is crystallized at a temperature not higher than 580° C. for 4 hours, and wherein a precursor gas used for forming said amorphous silicon film comprises silane expressed by a formula $Si_nH_{2n+2}$ where $n \geq 2$.

21. A method of fabricating a thin film transistor comprising the steps of:

forming an amorphous silicon film through LPCVD method on an insulating surface, wherein a precursor gas for forming said amorphous silicon film comprises silane expressed by a formula $Si_nH_{2n+2}$ where $n \geq 2$;

forming a catalyst element in contact with a selected portion of said amorphous silicon film, said catalyst element being capable of accelerating crystallization of said amorphous silicon film;

heating said amorphous silicon film so that a crystal growth occurs from said selected portion in a lateral direction to said insulating surface;

forming the thin film transistor in a laterally grown portion where the crystal growth occurs in the lateral direction to said insulating surface, wherein branching in a crystal growth direction within a lateral growth distance of 200 μm is eliminated.

22. A method according to claim 21 wherein said amorphous silicon film comprises oxygen at a concentration of $5\times10^{18}$ cm$^{-3}$ or lower.

23. A method of fabricating a thin film transistor comprising the steps of:

forming an amorphous silicon film through LPCVD method on an insulating surface, wherein a precursor gas for forming said amorphous silicon film comprises silane expressed by a formula $Si_nH_{2n+2}$ where $n \geq 2$;

forming a catalyst element in contact with a selected portion of said amorphous silicon film, said catalyst element being capable of accelerating crystallization of said amorphous silicon film;

heating said amorphous silicon film so that a crystal growth occurs from said selected portion in a lateral direction to said insulating surface;

forming the thin film transistor in a laterally grown portion where the crystal growth occurs in the lateral direction to said insulating surface, wherein an inert gas is introduced into a chamber for forming said amorphous silicon film before forming said amorphous silicon film to suppress an oxygen concentration in the amorphous silicon film.

24. A method according to claim 23 wherein said amorphous silicon film comprises oxygen at a concentration of $5\times10^{18}$ cm$^{-3}$ or lower.

25. A method according to claim 23 wherein said inert gas is helium.

26. A method of fabricating a thin film transistor comprising the steps of:

forming an amorphous silicon film through LPCVD method on an insulating surface, wherein a precursor gas for forming said amorphous silicon film comprises silane expressed by a formula $Si_nH_{2+2}$ where $n \geq 2$;

forming a catalyst element in contact with a selected portion of said amorphous silicon film, said catalyst element being capable of accelerating crystallization of said amorphous silicon film;

heating said amorphous silicon film so that a crystal growth occurs from said selected portion in a lateral direction to said insulating surface;

forming the thin film transistor in a laterally grown portion where the crystal growth occurs in the lateral direction to said insulating surface, wherein a chamber for forming said amorphous silicon film before forming said amorphous silicon film is at a pressure of $8\times10^{-3}$ Pa or lower.

27. A method according to claim 26 wherein said amorphous silicon film comprises oxygen at a concentration of $5\times10^{18}$ cm$^{-3}$ or lower.

28. A method of fabricating a thin film transistor comprising the steps of:

forming an amorphous silicon film through LPCVD method on an insulating surface, wherein a precursor gas for forming said amorphous silicon film comprises silane expressed by a formula $Si_nH_{2n+2}$ where $n \geq 2$;

forming a catalyst element in contact with a selected portion of said amorphous silicon film, said catalyst element being capable of accelerating crystallization of said amorphous silicon film;

heating said amorphous silicon film so that a crystal growth occurs from said selected portion in a lateral direction to said insulating surface;

forming the thin film transistor in a laterally grown portion where the crystal growth occurs in the lateral direction to said insulating surface, wherein said amorphous silicon film has a nucleation rate of $2\times10^8$ $cm^{-3}s^{-1}$ or lower.

29. A method according to claim 28 wherein said amorphous silicon film comprises oxygen at a concentration of $5\times10^{18}$ $cm^{-3}$ or lower.

* * * * *

UNITED STATES PATENT AND TRADEMARK OFFICE
CERTIFICATE OF CORRECTION

| | |
|---|---|
| PATENT NO. | : 5,970,327 |
| DATED | : October 19, 1999 |
| INVENTOR(S) | : Naoki Makita, Takashi Funai and Toru Takayama |

It is certified that error appears in the above-identified patent and that said Letters Patent is hereby corrected as shown below:

<u>Title page,</u>
Replace item # 73 with the following:

-- [73] Assignee: Semiconductor Energy Laboratory Co., Ltd., Kanagawa; Sharp Kabushiki Kaisha, Osaka, both of Japan --

Signed and Sealed this

Twenty-third Day of October, 2001

Attest:

*Nicholas P. Godici*

NICHOLAS P. GODICI
*Attesting Officer*  *Acting Director of the United States Patent and Trademark Office*